(12) United States Patent  (10) Patent No.: US 7,557,500 B2
Nakamura et al.  (45) Date of Patent: Jul. 7, 2009

(54) ELECTROLUMINESCENT ELEMENT AND METHOD FOR MANUFACTURING THE SAME

(75) Inventors: Norikatsu Nakamura, Tokyo (JP); Yoshihiro Kobayashi, Tokyo (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 515 days.

(21) Appl. No.: 10/513,229

(22) PCT Filed: May 6, 2003

(86) PCT No.: PCT/JP03/05659

§ 371 (c)(1), (2), (4) Date: Nov. 2, 2004

(87) PCT Pub. No.: WO03/096756

PCT Pub. Date: Nov. 20, 2003

(65) Prior Publication Data

US 2005/0168140 A1 Aug. 4, 2005

(30) Foreign Application Priority Data

May 7, 2002 (JP) ............................. 2002-131796

(51) Int. Cl.
*H01J 1/62* (2006.01)
*G02F 1/335* (2006.01)
*H05B 33/10* (2006.01)

(52) U.S. Cl. .......................... 313/506; 445/24; 445/25; 313/507

(58) Field of Classification Search ......... 313/500–507; 445/24–25; 427/60–61
See application file for complete search history.

(56) References Cited

U.S. PATENT DOCUMENTS

| 6,573,650 | B2 * | 6/2003 | Aoki et al. | 313/503 |
| 6,610,552 | B2 * | 8/2003 | Fujimori et al. | 438/22 |
| 6,617,186 | B2 * | 9/2003 | Kashiwabara | 438/29 |
| 7,211,543 | B2 * | 5/2007 | Nakabayashi et al. | 502/150 |
| 2001/0022497 | A1 * | 9/2001 | Aoki et al. | 313/507 |
| 2002/0006558 | A1 * | 1/2002 | Kobayashi et al. | 430/7 |
| 2002/0016031 | A1 * | 2/2002 | Fujimori et al. | 438/200 |
| 2002/0022184 | A1 * | 2/2002 | Tanaka et al. | 430/5 |
| 2002/0140346 | A1 * | 10/2002 | Tsukiyama | 313/502 |

FOREIGN PATENT DOCUMENTS

| EP | 0 989 778 A1 | 3/2000 |
| JP | 9-203803 A | 8/1997 |
| JP | 2000-223270 A | 8/2000 |

(Continued)

*Primary Examiner*—Sikha Roy
*Assistant Examiner*—Tracie Y Green
(74) *Attorney, Agent, or Firm*—Ladas & Parry LLP

(57) ABSTRACT

A main object of the present invention is to provide an EL element in which an inconvenience, resulting from uneven film thickness or generation of small clearances at a boundary in between layers due to a liquid repellent treatment, is prevented.

In order to achieve the object, the present invention provides an electroluminescent element comprising: a substrate having at least a first electrode layer; an insulating layer formed so as to cover an edge portion of the first electrode layer; a liquid repellent portion provided on an upper surface of the insulating layer; a light emitting layer formed in a pattern on the first electrode layer; and a second electrode layer formed on the light emitting layer.

9 Claims, 5 Drawing Sheets

FOREIGN PATENT DOCUMENTS

| | | |
|---|---|---|
| JP | 2000-353594 A | 12/2000 |
| JP | 2001-76881 A | 3/2001 |
| JP | 2002-15866 A | 1/2002 |
| JP | 2002-22932 A | 1/2002 |
| JP | 2002-62421 A | 2/2002 |
| JP | 2002-139614 A | 5/2002 |

* cited by examiner

US 7,557,500 B2

ELECTROLUMINESCENT ELEMENT AND METHOD FOR MANUFACTURING THE SAME

This application is a U.S. National Phase of International Patent Application Ser. No. PCT/JP03/05659, filed May 6, 2003 which claims priority of Japanese Patent Application No. 2002-131796, filed May 7, 2002.

TECHNICAL FIELD

The present invention relates to an electroluminescent (will occasionally be abbreviated as "EL" hereinafter) element having an organic electrolight emitting layer, which enables highly precise luminescence by overcoming an inconvenience resulted from, for example, uneven film thickness of a light emitting layer. The present invention also relates to a method for manufacturing the electroluminescent element.

BACKGROUND ART

An EL element is characterized in that: holes and electrons injected from facing electrodes are coupled within a light emitting layer thereof; a fluorescent substance in the light emitting layer is excited by the energy generated by the coupling; and the fluorescent substance thus excited emits light of a color in accordance with the type of the fluorescent substance. The EL elements have been attracting attention as self-luminescent display elements each having a plane surface. Among those EL elements, an organic thin film EL display using an organic substance as a luminescent material has high emitting efficiency, that the organic thin film EL display realizes light emission of a high brightness, even when an applied voltage is less than 10 V, and enables light emission with a simple element structure. Thus, the organic thin film EL display is expected to be applied to a low price simple display, such as an advertisement display, which displays a specific pattern by light emission.

When a display using such an EL element as described above is manufactured, patterning of an electrode layer, a light emitting layer, a buffer layer and the like is generally carried out.

When patterning of each layer as described above is carried out, a substrate is subjected to a liquid repellent treatment in advance, in some cases, in order to improve the patterning precision. As a result of such a liquid repellent treatment, for example, color mixture of a light emitting layer comprising a plurality of colors is prevented, whereby a highly precise EL element can be manufactured.

However, by the liquid repellent treatment, unwanted portion may be subjected to the treatment in some cases. FIG. 6 shows such an undesirable state. In FIG. 6, a first electrode layer 62 is formed on a substrate 61, and an insulating layer 63 is formed so as to cover edge portions of the first electrode layer 62. The insulating layer 63 has been subjected to a liquid repellent treatment. Because of the liquid repellent treatment subjected to the insulating layer 63, there may be an inconvenience such as a film thickness of a light emitting layer 64, which is formed thereafter, is thinner, or a small clearance "a" is formed at a boundary between the light emitting layer 64 and the insulating layer 63. Such uneven film thickness and clearance "a" may could cause inconvenience, for example, a short-circuit due to a continuity between a second electrode layer 65 formed on the light emitting layer 64 and the first electrode layer 62. Thus, an inconvenience resulting from the liquid repellent treatment needs to be prevented.

DISCLOSURE OF THE INVENTION

The present invention has been contrived in consideration of the aforementioned problems. A main object of the present invention is to prevent an inconvenience resulting from a small clearance between the light emitting layer and an insulating layer and uneven film thickness of a light emitting layer, which are generated because the light emitting layer recedes at a side surface of the insulating layer due to an influence of the liquid repellency held by the insulating layer.

In order to achieve the above mentioned object, the present invention provides an electroluminescent element comprising:

a substrate having at least a first electrode layer;
an insulating layer formed so as to cover an edge portion of the first electrode layer;
a liquid repellent portion provided on an upper surface of the insulating layer;
a light emitting layer formed in a pattern on the first electrode layer; and
a second electrode layer formed on the light emitting layer.

As mentioned above, by providing the liquid repellent portion on the upper surface of the insulating layer, side surfaces of the insulating layer do not exhibit liquid repellency. Accordingly, when the light emitting layer is formed in between the insulating layers, generation of small clearances and uneven film thickness of the light emitting layer, at the boundary between the insulating layer and the light emitting layer, are prevented, whereby any inconvenience resulting from the above, such as short-circuit, can be avoided.

In the present invention, it is preferable that a contact angle difference, to a coating solution having a 30 mN/m surface tension, between the liquid repellent portion and the insulating layer is 10° or more.

By setting the contact angle difference between the liquid repellent portion and the insulating layer within the aforementioned range, when the light emitting layer forming coating solution is coated, the coating solution is prevented from being coated on the liquid repellent portion, whereby the light emitting layer of a desired configuration can be formed.

Further, in order to achieve the above mentioned object, the present invention provides an electroluminescent element comprising:

a substrate having at least a first electrode layer;
an insulating layer formed so as to cover an edge portion of the first electrode layer;
a photocatalyst containing layer, formed on the first electrode layer and the insulating layer, composed of at least a photocatalyst and a binder;
a light emitting layer formed in a pattern on the photocatalyst containing layer; and
a second electrode layer formed on the light emitting layer,
wherein a portion of the photocatalyst containing layer, which is located on an upper surface of the insulating layer, is a liquid repellent portion having liquid repellency, and the remaining portion of the photocatalyst containing layer is a lyophilic portion having liophilicity, and
the light emitting layer is formed on the lyophilic portion.

A pattern, due to a wettability difference, can be easily formed in the photocatalyst containing layer simply by irradiating the layer with energy. In the present invention, by using a photocatalyst containing layer having such a proprty for forming the liquid repellent portion, a pattern can be easily formed in which a region located on the upper surface of the insulating layer is made liquid repellent and the remaining region is made lyophilic. Further, the light emitting layer can be formed in a satisfactory manner in a desired region by forming the light emitting layer on the lyophilic region, whereby inconvenience resulting from a small clearance and uneven film thickness, generated due to the retreat of the light emitting layer, can be prevented.

In the present invention, it is preferable that the photocatalyst is one kind or two or more kinds of substances selected from a titanium oxide ($TiO_2$), a zinc oxide (ZnO), a tin oxide ($SnO_2$), a strontium titanate ($SrTiO_3$), tungsten oxide ($WO_3$), bismuth oxide ($Bi_2O_3$) and an iron oxide ($Fe_2O_3$). Among these substances, it is paricularly preferable that the photocatalyst is the titaiumoxide. This is because the titanium oxide is effective as a photocatalyst since it has high band gap energy, is chemically stable, non-toxic and is easily available.

In the present invention, it is preferable that the binder is an organo polysiloxane as a hydrolyzed condensate or a cohydrolyzed condensate of one kind or two or more kinds of silicon compounds represented by $Y_nSiX_{(4-n)}$ (Here, Y is an alkyl group, a fluoro alkyl group, a vinyl group, an amino group, a phenyl group or an epoxy group, X is an alkoxyl group or a halogen, and n is an integer from 0 to 3.).

This is because, by forming the photocatalyst containing layer using such an organopolysiloxane as a material, the wettability difference between the lyophilic portion and the liquid repellent portion can be easily increased.

In the present invention, it is preferable that a contact angle difference, to a coating solution having a 30 mN/m surface tension, between the liquid repellent portion and the lyophilic portion is 10° or more.

By setting the contact angle difference between the liquid repellent portion and the lyophilic portion within the aforementioned range, when the light emitting layer forming coating solution is coated on the lyophilic portion thereafter, the coating solution is prevented from being coated on the liquid repellent portion, whereby the light emitting layer of a desired patern can be formed.

In the present invention, it is preferable that the width of the liquid repellent portion is in a range of 0.2 times to 0.9 times of the width of the insulating layer, and is formed at the center portion of the insulating layer.

As the liquid repellent portion is provided on the upper surface of the insulating layer within the above mentioned range, end portions of the upper surface of the insulating layer do not hold liquid repellency to the light emitting layer forming coating solution. Due to this, in a case in which the light emitting layer is formed on the first electrode layer, the light emitting layer can be formed such that the light emitting layer creeps up to the end portions of the upper surface of the insulating layer. When the light emitting layer is formed so as to have such a shape, small clearances and uneven film thickness of the light emitting layer at the boundary between the insulating layer and the light emitting layer can be prevented, whereby inconvenience, such as short-circuit, resulting from these can be avoided. Further, in a case in which the light emitting layer is formed on the lyophilic portion of the photocatalyst containing layer, as the light emitting layer exhibits excellent adhesion only to the lyophilic portion, an effect similar to that described above can be obtained.

Further, the present invention provides a method for manufacturing an electroluminescent element, at least comprising processes of:

forming an insulating layer in a pattern, on a substrate having at least a first electrode layer, so as to cover an edge portion of the first electrode layer;

forming a photocatalyst containing layer, on the substrate having the insulating layer provided thereon, comprising at least a photocatalyst and a binder, and whose wettability is varied by an energy irradiation;

forming a liquid repellent portion, which is a non-energy irradiated area, and a lyophilic portion, which is an energy iraddiated area, by irradiating the photocatalyst containing layer in a pattern so as an upper surface of the insulating layer maintains liquid repellency;

forming a light emitting layer by coating the lyophilic portion with a light emitting layer forming coating solution; and forming a second electrode layer on the light emitting layer.

In the present invention, by irradiating the photocatalyst containing layer in a pattern, an irradiated area will be a lyophilic portion and a non-irradiated area will remain as a liquid repellent portion. By forming the light emitting layer on the photocatalyst containing layer which has been thus treated, the boundaries of the light emitting layer is formed with a desired shape. And further, in a case in which the second electrode layer is formed on the light emitting layer, a small clearance and uneven film thickness of the light emitting layer are less likely to be formed at the boundary between the light emitting layer and the second electrode layer, whereby a possibility that an inconvenience, such as short-circuit, resulting from these factors can be reduced to a maximum extent.

In the present invention, it is preferable that a contact angle difference, to a coating solution having a 30 mN/m surface tension, between the liquid repellent portion and the lyophilic portion is 10° or more.

By setting the contact angle difference, between the liquid repellent portion and the lyophilic portion, within the aforementioned range, when the light emitting layer forming coating solution is coated to the lyophilic portion later on, the coating solution is prevented from being coated on the liquid repellent portion, whereby the light emitting layer of a desired pattern can be formed.

Further, the present invention provides a method for manufacturing an electroluminescent element, comprising the processes of:

forming an insulating layer in a pattern, on a substrate having at least a first electrode layer, so as to cover an edge portion of the first electrode layer;

forming a resist layer by coating the substrate, having at least the first electrode layer and the insulating layer, with a photosensitive resin containing fluorine;

forming a liquid repellent portion of the resist layer by forming the resist layer on an upper surface of the insulating layer, irradiating the resist layer, in a pattern via a photomask, and developing;

forming a light emitting layer at least on the first electrode layer of the substrate having the first electrode layer, the insulating layer and the liquid repellent portion provided thereon; and forming a second electrode layer on the light emitting layer.

In the present invention, a photosensitive resin containing fluorine is used as a material for forming the liquid repellent portion. Therefore, the liquid repellent portion can be easily formed on the upper surface of the insulating layer by photolithography. As the liquid repellent portion is provided on the upper surface of the insulating layer, liquid relellency is not required to the insulating layer itself. Accordingly, the light emitting layer does not recede at the boundary surface between the insulating layer and the light emitting layer so that a small clearance between the light emitting layer and the insulating layer and uneven film thickness are less likely to be formed. As a result, short-circuit and the like, resulting from these factors, can be prevented from occurring.

In the present invention, it is preferable that a contact angle difference, to a coating solution having a 30 mN/m surface tension, between the liquid repellent portion and the insulating layer is 10° or more. By setting the contact angle difference between the liquid repellent portion and the insulating layer within the aforementioned range, when the light emitting layer forming coating solution is coated to the first electrode layer later on, the coating solution is prevented from being coated on the liquid repellent portion, whereby color mixtuer of lines of the light emitting layer can be prevented.

In the present invention, it is preferable that the width of the liquid repellent portion is in a range of 0.2 times to 0.9 times of the width of the insulating layer, and is formed at the center portion of the insulating layer.

As the liquid repellent portion is provided on the upper surface of the insulating layer within the above mentioned range, end portions of the upper surface of the insulating layer do not hold liquid repellency to the light emitting layer forming coating solution. Due to this, in a case in which the light emitting layer is formed on the first electrode layer, the light emitting layer can be formed such that the light emitting layer creeps up to the end portions of the upper surface of the insulating layer. Therefore, a small clearance is less likely to be formed at the boundary surface of the insulating layer and the light emitting layer, and uneven film thickness can be prevented. As a result, an inconvenience such as short-circuit, resulting from these factors, can be prevented. Further, in a case in which the liquid repellent portion is formed on the insulating layer by using the photocatalyst containing layer, since the light emitting layer is prevented from having undesirable shape, an effect similar to that described above can be obtained.

BEST MODE FOR CARRYING OUT THE INVENTION

Hereinafter, an EL element and a method for manufacturing the EL element of the present invention will be described. The EL element of the present invention comprises: a substrate having at least a first electrode layer; an insulating layer formed so as to cover an edge portion of the first electrode layer; a liquid repellent portion provided on an upper surface of the insulating layer; a light emitting layer formed in a pattern on the first electrode layer; and a second electrode layer formed on the light emitting layer.

(EL Element)

Figure 1:
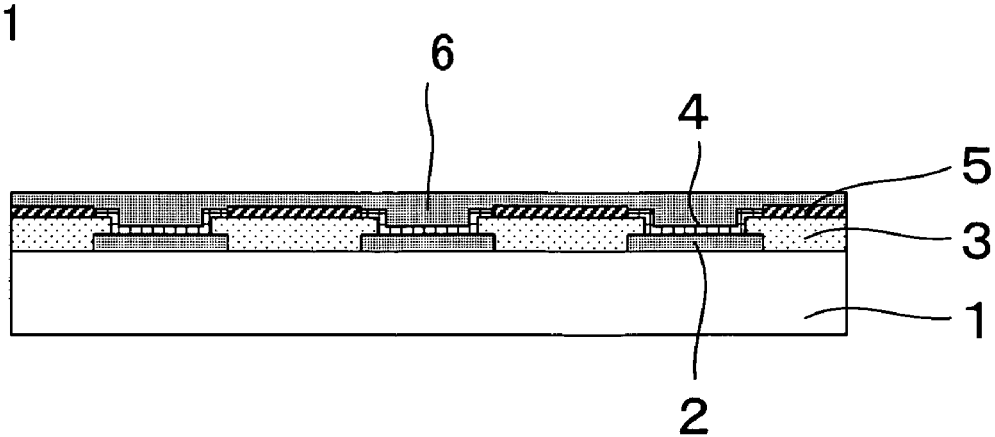
FIG. 1 is a schematic sectional view showing one example of an EL element of the present invention.

One example of the EL element having the above mentioned properties, of the present invention, is shown in FIG. 1.

FIG. 1 shows a first electrode layer 2 formed in stripes on a substrate 1; an insulating layer 3 formed so as to cover an edge portion of the first electrode layer 2; a liquid repellent portion 5 formed at a part of an upper surface of the insulating layer 3; a light emitting layer 4 formed on the first electrode layer 2 and at the end portions of the upper surface of the insulating layer 3 such that the light emitting layer 4 creeps up to the end portions; and a second electrode layer 6 provided, on the light emitting layer 4 and on the liquid repellent portion 5, so as to cross the first electrode layer 2 perpendicularly.

Figure 2:
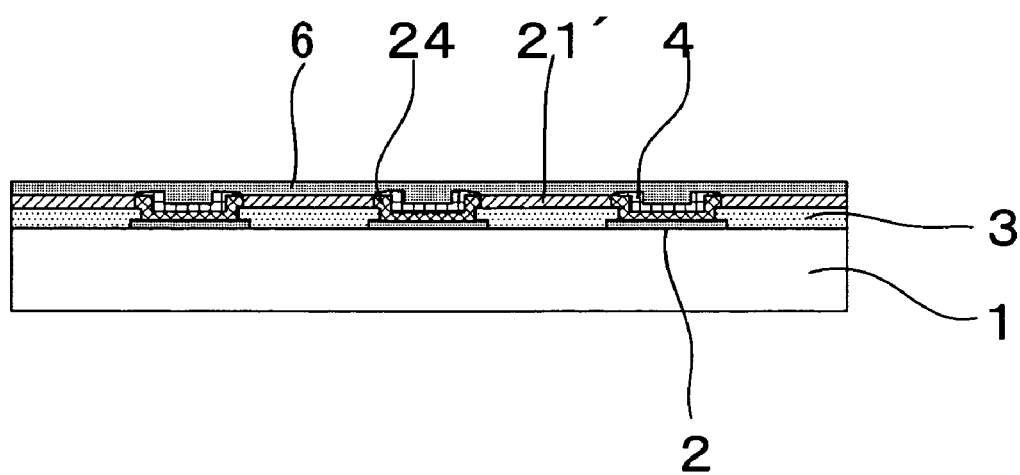
FIG. 2 is a schematic sectional view showing another example of an EL element of the present invention.

Further, another embodiment of the EL element of the present invention is shown in FIG. 2.

FIG. 2 shows: a first electrode layer 2 formed in stripes on a substrate 1; an insulating layer 3 formed so as to cover an edge portion of the first electrode layer 2; a photocatalyst containing layer 21, formed so as to cover the first electrode layer 2 and the insulating layer 3, whose wettability is reduced by energy irradiation; a lyophilic portion 24 which is an energy-irradiated area of the photocatalyst containing layer 21; a light emitting layer 4 formed on the lyophilic portion 24; and a second electrode layer 6 formed on the light emitting layer 4 and the photocatalyst containing layer 21.

In the present invention, as described above, there are two embodiments, which differ from each other in the manner of providing the liquid repellent portion. The embodiment shown in FIG. 1 will be referred to as a first embodiment, and the embodiment shown in FIG. 2 will be referred to as a second embodiment, hereinafter. Each configuration of the present invention will be described in detail below.

Figure 6:
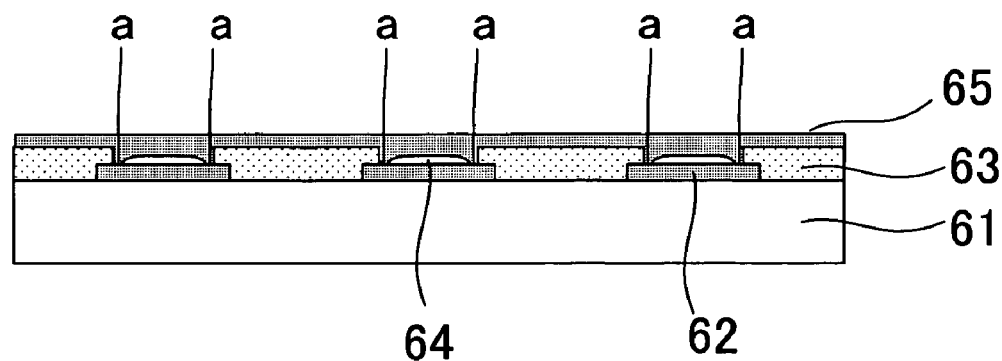
FIG. 6 is a schematic sectional view showing one example of the conventional EL element.

Here, when a cross section of the insulating layer has substantially rectangle shape as shown in FIG. 1, an "upper surface" of the insulating layer represents an upper surface thereof in general. However, in a case in which the insulating layer has a doom-like shape as the light emitting layer 64 of FIG. 6, the "upper surface" of the insulating layer represents the surface portion of the insulating layer, which excludes at least a rise-up portion thereof which is in contact with the first electrode layer.

(1) First Embodiment

The first embodiment has a structure which, as shown in FIG. 1, comprises at least: a substrate 1 having at least a first electrode layer 2; an insulating layer 3 formed so as to cover an edge portion of the first electrode layer 2; a liquid repellent portion 5 provided on an upper surface of the insulating layer 3; a light emitting layer 4 formed in a pattern on the first electrode layer 2; and a second electrode layer 6 formed on the light emitting layer 4. The present invention is characterized, in particular, in that the liquid repellent portion is provided on the upper surface of the insulating layer. Thus, the liquid repellent portion will be described in detail first, followed by the descriptions of other components.

1. Liquid Repellent Portion

The liquid repellent portion of the present invention is not particularly limited, as long as at least the surface of the liquid repellent portion has liquid repellency and exhibits sufficient liquid repellency with respect to the light emitting layer forming coating solution, which forms the light emitting layer. Specifically, as shown in FIG. 1, a layer having liquid repellency may be separately provided on a part of the upper surface of the insulating layer. Alternatively, a part of the upper surface of the insulating layer may directly be subjected to a surface treatment, so that the part of the upper surface of the insulating layer is made to have liquid repellency.

The liquid repellent portion of the present invention, characterized as described above, will be described in detail hereinafter.

1) Regarding Liquid Repellency of the Surface of the Liquid Repellent Portion

Regardinh the liquid repellency in the present invention, a contact angle, to a coating solution having a 30 mN/m surface tension, is preferably 10° or more, especially preferably 20° or more, and most preferably 30° or more. When the contact angle to the coating solution having a 30 mN/m surface tension is smaller than the aforementioned range, since the liquid repellency is not sufficient, the light emitting layer forming coating solution, which forms the light emitting layer on the surface, in particular on the upper surface, of the liquid repellent portion, will adhere, and there may be a color mixture of the patterns of different colors.

Further, in the present invention, it is preferable that the light emitting layer is formed not only on the first electrode layer but also formed such that the light emitting layer creeps up to the end portion of the upper surface of the insulating layer. Therefore, the difference in the wettability, between the surface of the liquid repellent portion and the end of the upper surface of the insulating layer to which the light emitting layer forming coating solution creeps up and is coated, is important to form the light emitting layer in high precision. Specifically, to the coating solution having a 30 mN/m surface tension, it is preferable that a contact angle difference between the liquid repellent portion and the insulating layer is 10° or more, more preferably 15° or more, and most preferably 20° or more. When the difference in wettability is smaller than the above mentioned range, the light emitting layer forming coating solution may adhere to the surface of the liquid repellent portion, and further, may reach to other regions beyond the liquid repellent portion, which is not preferable.

The contact angle to liquid here referred to is obtained by measuring contact angle (30 seconds after dropping droplets from a micro syringe) by a contact angle measuring apparatus (CA-Z type, manufactured by Kyowa Interface Science Co., LTD.).

In the present invention, methods for imparting the liquid repellency as described above to the liquid repellent portion include: a method in which the liquid repellent portion itself is formed with a liquid repellent material; and a method in which a part of the upper surface of the insulating layer is subjected to a surface treatment to impart a liquid repellency. Hereafter, each method will be described.

A. Method for Forming Liquid Repellent Portion Itself with a Liquid Repellent Material As materials having liquid repellency, a liquid repellency can be imparted to the surface of the liquid repellent portion by selecting a resin material itself, or liquid repellency can be imparted by adding an additive to a resin material.

Examples of the resin material having liquid repellency by itself include fluorine based polytetrafluoroethylene (PTFE), a silicone-based resin and the like.

In the present invention, liquid repellency may be provided either by forming the liquid repellent portion only from such materials as described above or by blending these materials with other conventionally known materials. The ratio of blending in the latter case may be adjusted such that the resin material resulting from the blending satisfies the above mentioned conditions of wettability.

The additives added to the resin material, to improve the liquid repellency of the surface of the liquid repellent portion formed of the resin material, is not particularly limited as long as the additives do not affect the light emitting layer and the like. Specific examples of the additives include a fluorine-based resin, a silicon-based resin, a copolymer oligomer, whose main component is acrylate or methacrylate comprising perfluoroalkyl group, and the like. Among these examples, a copolymer oligomer, whose main component is acrylate or methacrylate comprising perfluoroalkyl group is preferable. Examples of commercially available products include: "Sarfron" (random type oligomer, manufactured by SEIMI CHEMICAL Co., Ltd.), "Aron G" (graft type oligomer, manufactured by TOAGOSEI Co., Ltd.), "Modiper F" (block type oligomer, manufactured by NOF Corporation) and the like.

The amount of such an additive to be added to the resin material, varies greately depending on the types of the additives and the types of the resins. When the amount of the resin material to be used is 100 parts by weight, the amount of the additive to be added thereto is preferably in a range of 0.1 to 20 parts by weight, and more preferably in a range of 0.5 to 5 parts by weight.

When Modiper F 200 (manufactured by NOF Corporation) is used as the additive, the liquid repellency is exhibited by adding 0.1 wt % of the additive to the resin. However, it is preferable that 2 wt % is added to the resin.

In the present invention, when the resin material is formed with a material having the liquid repellent by itself, the additive as described above, which imparts the liquid repellency, may further be added, if necessary.

B. Method for Subjecting a Liquid Repellency Treatment to a Part of the Upper Surface of the Insulating Layer The treatment method for imparting liquid repellency to a part of the upper surface of the insulating layer is not particularly limited. For example, the liquid repellency can be imparted by a treating method in which a surface is treated, in a pattern, with liquid repellent treating agent such as a silicone compound or a fluorine containging compound.

Further, in the present invention, it is possible to carry out a surface treatment utilizing plasma of fluorocarbon gas.

The surface treatment utilizing plasma of fluorocarbon gas enables to carry out the liquid repellent treatment selectively to an organic substance part. Such a selective treatment is possible because plasma of fluorocarbon gas only reacts with an organic substance, and thus, only an organic material part is selectively treated. Accordingly, in a case in which the insulating layer is composed of an organic material, only a desired area can be made liquid repellent by carrying out such a surface treatment via a mask.

Specifically, the treatment utilizing plasma of fluorocarbon gas is carried out by: placing a substrate in a chamber; after evacuating, introducing $CF_4$ (flow rate: 50 sc cm) and maintained inside at a constant pressure (150 mTorr); and carrying out plasma treatment at RF power of 150 W for 5 minutes. Examples of the dry etching device to be used include DEA-506T (manufactured by ANELVA Co., Ltd.) and the like.

In the present invention, examples of flurocarbon gas to be used include $CF_4$, $C_2F_6$, $C_3F_8$, $c-C_4F_8$, $CCl_2F_2$, $CClF_3$, $C_2Cl_2F_4$, $C_2ClF_5$, $CBrF_3$, $CHF_3$, $C_2H_3F_3$, $CH_3CHF_2$, $NF_3$, $SF_6$ and the like. Among these examples, $CF_4$ is preferably used.

When the surface treatment utilizing plasma of fluorocarbon gas is carried out, it is preferable that a surface treatment using plasma of oxygen gas is carried out beforehand. It is possible to make the wettability difference greater by making the surface of the insulating layer lyophillic, as a result of the surface treatment using plasma of oxygen gas as described above, and then, surface treating a part of the surface of the insulating layer with plasma of fluorocarbon gas via a mask.

Thus, adherance of the light emitting layer forming coaring solution to a part of the upper surface of the insulating layer, where the liquid repellency is imparted, can be more effectively prevented.

2) Shape of the Liquid Repellent Portion

The shape of the liquid repellent portion employed in the present invention is not particularly limited, as long as it is a shape which, when the light emitting layer forming coating solution is coated, can prevent the coating solution from mixing with the light emitting layer formed in other regions beyond the liquid repellent portion. Specifically, in a case in which a liquid repellent layer is separately provided as shown in FIG. 1, the shape of the liquid repellent portion may be either a shape like a quadrangle or a doom-like shape. In a case in which the liquid repellent portion is formed on the upper surface of the insulating layer by the liquid repellency treatment, the shape of the liquid repellent portion is not particularly limited as long as the upper surface of the insulating layer exhibits liquid repellency.

The width of the liquid repellent portion may be set such that the liquid repellent portion covers the entire surface of the upper surface of the insulating layer. The width of the liquid repellent portion is preferably in a range of 0.2 times to 0.9 times, more preferably 0.5 times to 0.8 times, of the width of the insulating layer. Further, it is preferable that the liquid repellent portion is formed at the center portion of the insulating layer.

This is because it is preferable, as shown in FIG. 1, that the light emitting layer, formed on the first electrode layer and between the insulating layers later on, is formed not only on the first electrode layer but also formed so as to creep up to the edge portions of the insulating layer. When the light emitting layer is formed such that it creeps up to the edge portions of the insulating layer, the thickness of the film placed at the light emitting portion is less likely to be uneven and a small clearance in between the insulating layer and the light emitting layer is not formed, whereby excellent light emission can be obtained.

2. First Electrode Layer

In the EL element of the present invention, the first electrode layer is formed in stripes on the substrate. As described above, light is generally emitted to the substrate side. Thus, it is preferable that the first electrode layer formed on the substrate is a transparent electrode. Specific examples thereof include a tin oxide film, ITO film, a composite oxide film of an indium oxide and a zinc oxide, and the like. In the present invention, ITO film is preferably used.

The first electrode layer described above is formed in a form of lines (in stripes) on the substrate. Generally, the first electrode layer is formed by patterning in form of lines by photolithography or the like.

3. Insulating Layer

In the present invention, the insulating layer is formed so as to cover an end portion of the upper surface of the first electrode layer, in order to reduce an influence of charge concentration at the end portions.

It is a conventional practice that the insulating layer is formed so as to cover end portions of the first electrode layer such that charge is prevented from concentrating at the end portions of the first electrode layer. It is also a conventional practice that the insulating layer itself is made liquid repellent in order to improve a precision in patterning. In such a case, when the light emitting layer forming coating solution is coated, there is a possibility that the coating solution is influenced by the liquid repellent insulating layer and recedes from the position where the coating solution has been placed resulting in a small clearance in between the light emitting layer and the insulating layer. This small clearance may be a factor causing short-circuits of the first electrode layer and the second electrode layer. In order to avoid such an inconvenience, the present invention is characterized in: a method in which the insulating layer is formed of a material without liquid repellency and, in order to improve a precision in patterning, a layer having liquid repellency is separately provided on the upper surface of the insulating layer; and a method in which the upper surface of the insulating layer is subjected to a liquid repellency treatment to impart the lquid repellency to a part of the upper surface of the insulating layer.

Here, the shape of the insulating layer is not particularly limited as long as it is a shape entirely covers the edge portions of the first electrode layer. Specifically, as shown in FIG. 1, the insulating layer may be formed such that it extends continuously from an edge portion of a first electrode layer to an edge portion of another first electrode layer. Alternatively, each insulating layer may be formed such that it only covers an edge portion of a first electrode layer.

Further, in the present invention, it is preferable that the insulating layer, in particular, the side surfaces thereof, is form such that it has lyophilicity. By formed in such a manner, when the light emitting layer is formed in between the insulating layers, formation of a small clearance in between the insulating layer and the light emitting layer can be avoided.

Examples of the method for imparting the lyophilicity to the insulating layer include: a method in which the insulating layer is formed with a lyophilic material; and a method the lyophilicity is imparted by a surface treatment. It is preferable to impart the lyophilicity to a degree that the coated light emitting layer forming coating solution shows a good adhesion to a surface of the insulating layer where the liquid repellent portion is not formed.

Specifically, it is preferable that the contact angle to a coating solution having a 30 mN/m surface tension is in a range of 0° to 30°.

When the insulating layer shows lyophilicity in such a range as described above, the insulating layer shows a good adhesion to the light emitting layer formed thereafter, whereby formation of a small clearance in between the insulating layer and the light emitting layer is prevented.

Examples of the material of the insulating layer used in the present invention include a novolak resin, polyimide and the like, which are known as lyophilic materials.

4. Light Emitting Layer

In the present invention, after the first electrode layer, the insulating layer and the liquid repellent portion are formed on the substrate, the light emitting layer is formed on the first electrode layer.

The light emitting layer is an essential layer in an EL element. Further, in a case in which a full-color or multi-color display is manufactured, a highly precise patterning is required. In the present invention, a coating solution used to form such a light emitting layer is called a light emitting layer forming coating solution. Hereinafter, the composition and the like of the light emitting layer forming coating solution will be described in detail.

1) Light Emitting Layer Forming Coating Solution

The light emitting layer forming coating solution, used in the present invention, is generally composed of a light emitting material, a solvent and an additive such as a doping agent. When a full-color display is manufactured, since light emitting layers of a plurality of colors are formed, a plurality of kind of the light emitting layer forming coating solutions are generally used. Hereinafte, each material constituting the light emitting layer forming coating solution will be described.

A. Light Emitting Material

Examples of the light emitting material used in the present invention include a dye based material, a metal complex based material and a polymer based material.

a. Dye Based Material

As the dye based material, cyclopendamine derivative, tetraphenyl butadiene derivative, triphenylamine derivative, oxadiazole derivative, pyrazoquinoline derivative, distyrylbenzene derivative, distyrylarylene derivative, silol derivative, thiophen ring compound, pyridine ring compound, perynone derivative, perylene derivative, oligothiophen derivative, trifumanylamine derivative, oxadiazole dimer, pyrazoline dimer and the like are listed.

b. Metal Complex Based Material

As the metal complex based material, metal complexes having Al, Zn, Be and the like or a rare earth metal such as Tb, Eu, Dy and the like as the center metal and oxadiazole, thiadiazole, phenylpyridine, phenylbenzimidazole, quinoline structure and the like as the ligand, such as an alumiquinolinol complex, benzoquinolinolberyllium complex, benzooxazolezinc complex, benzothiazolezinc complex, azomethylzinc complex, porphyrinzinc complex, europium complex and the like are listed.

c. Polymer Based Material

As the polymer based material, those obtained by polymerizing polyparaphenylenevinylene derivatives, polythiophene derivatives, polyparaphenylene derivatives, polysilane derivatives, polyacetylene derivatives, polyfluorene derivatives, polyvinylcarbazole derivatives, the above mentioned dyes, metal complex based light emitting materials and the like are listed.

Since the present invention is to solve a problem when a light emitting layer forming coating solution is used, it is more preferable to use the above mentioned polymer based material as the light emitting material from the standpoint that it can be formed by only such light emitting layer forming coating solution.

B. Solvent

The solvent for dissolving or dispersing the above mentioned light emitting material to give light emitting layer forming coating solution is not particularly limited as long as it is a solvent capable of dissolving or dispersing the above mentioned light emitting material and providing predetermined viscosity.

Specifically, chloroform, methylene chloride, dichloroethane, tetrahydrofuran, toluene, xylene and the like are listed.

C. Additive

Into the light emitting layer forming coating solution used in the present invention, various additives can be added in addition to the above mentioned light emitting materials and solvents. For example, a doping material is added in some cases for the purpose of improving light emitting efficiency in a light emitting layer and changing wavelength of emitting light. As this doping material, for example, perylene derivatives, coumarin derivatives, rubrene derivatives, quinacridone derivatives, squalirium derivatives, porphyrin derivatives, styryl based dyes, tetracene derivatives, pyrazoline derivatives, decacyclene, phenoxazone and the like are listed.

5. Second Electrode Layer

The second electrode layer is formed by vapor deposition on the light emitting layer as described above. The second electrode layer is not particularly limited as long as the second electrode layer is made of a material which is formed by vapor deposition. Specific examples of such a material include metals having small work function such as: magnesium alloy such as MgAg; aluminum alloy such as AlLi, AlCa and AlMg; alkali metals and alkali earth metals such as Li, Ca; and alloys of these alkali metals and alkali earth metals.

6. Substrate

The substrate is not particularly limited. As light is generally emitted to both substrate sides, a highly transparent substrate is preferable. Examples of such a highly transparent substrate include an inorganic material such as glass, a transparent resin and the like.

The transparent resin is not particularly limited as long as the resin can be molded to a film-like shape. A polymer material having a high transparency, a solvent resistance and relatively heat resistance is preferable. Specific examples thereof include polyethersulfone, polyethylene terephthalate (PET), polycarbonate (PC), polyetheretherketone (PEEK), polyvinyl fluoride (PFV), polyacrylate (PA), polypropylene (PP), polyethylene (PE), amorphous polyolefin, fluorine based resin, polyethylene, polypropylene, polyvinyl chloride, polyvinyl fluoride, polystyrene, ABS resin, polyamide, polyacetal, polyester, polycarbonate, modified polyphenylene ether, polysulfone, polyarylate, polyetherimide, polyethersulfone, polyamideimide, polyimide, polyphenylenesulfide, liquid cryltal polyester, polyethylene terephthalate, polybutylene terephthalate, polymicroxylenedimethylene terephthalate, polyoxymethylene, polyethersulfone, polyetheretherketone, polyacrylate, acrylonitryl-styrene resin, ABS resin, phenol resin, urea resin, melamine resin, unsaturated polyester resin, epoxy resin, polyurethane, silicone resin, amorphous polyolefin and the like.

7. Others

In the present invention, in addition to the functional layers described above, various types of other organic EL layers may further be provided. Examples of such other organic EL layers include a light emitting layer, a buffer layer, a hole transporting layer, a hole injecting layer, an electron transporting layer, an electron injecting layer and the like. The light emitting layer described above is one of these other organic EL layers. As is the case with the light emitting layer, each of these other organic EL layers can be formed in a pattern. Among the other organic EL layers other than the light emitting layer, a buffer layer which is often formed with the light emitting layer will be briefly described below.

A buffer layer is a layer containing an organic substance, in particular, an organic conductive material, provided in between the anode and the light emitting layer or in between the cathode and the light emitting layer, in order to facilitate injection of charge to the light emitting layer. For example, improving a hole injecting efficiency to the light emitting layer, a conductive polymer, with functions to flatten the unevenness such as electrode, can be obtained.

Specific examples of the material for forming the buffer layer include: polymer of a hole transporting substance, such as polyalkylthiophen derivative, polyaniline derivative, triphenylamine and the like; a sol-gel film of an inorganic oxide; a polymerized film of an organic substance such as trifluoromethane and the like; a film of an organic compound comprising Lewis acid. These are dissolved or dispersed in a solvent such as water, alcohols such as methanol and ethanol, dimethylformamide, dimethylacetoamide, dimethylsulfox-

(2) Second Embodiment

In the second embodiment of the present invention, an EL element comprises: a substrate having at least a first electrode layer; an insulating layer formed so as to cover an edge portion of the first electrode layer; a photocatalyst containing layer, formed on the first electrode layer and the insulating layer, composed of at least a photocatalyst and a binder; a light emitting layer formed in a pattern on the photocatalyst containing layer; and a second electrode layer formed on the light emitting layer, wherein a portion of the photocatalyst containing layer, which is located on an upper surface of the insulating layer, is a liquid repellent portion having liquid repellency, and the remaining portion of the photocatalyst containing layer is a lyophilic portion having liophilicity, and the light emitting layer is formed on the lyophilic portion.

One example of the present embodiment characterized as described above is shown in FIG. 2. Hereinafter, FIG. 2 will be described specifically. The present embodiment at least comprises: a first electrode layer 2 formed in stripes on a substrate 1; an insulating layer 3 formed so as to cover an edge portion of the first electrode layer 2; a liquid repellent portion 21' having liquid repellency, formed on an upper surface of the insulating layer 3; a lyophilic portion 24 formed so as to be cotacted to the liquid repellent portion 21'; a light emitting layer 4 formed on the lyophilic portion 24; and a second electrode layer 6 formed on the light emitting layer 4, so as to cross the first electrode layer 2 perpendicularly. The liquid repellent portion 21' and the lyophilic portion 24 are formed, although the detailed processes of production are not shown in FIG. 2, by irradiating the photocatalyst containing layer with energy.

The present embodiment is characterized in that the liquid repellent portion is provided on the upper surface of the insulating layer by using the photocatalyst containing layer. Therefore, the structure of the present embodiment other than the photocatalyst containing layer is the same as that of the first embodiment, detailed description thereof will be omitted.

1. Photocatalyst Containing Layer

The present invention is characterized in that the liquid repellent portion is formed on the upper surface of the insulating layer by using the photocatalyst containing layer, which comprises at least a photocatalyst and a binder and whose wettability is varied by an energy irradiation.

By using the photocatalyst containing layer having properies as described above when forming the liquid repellent region, a pattern based on a difference in wettability can be easily formed only by irradiating the layer with energy. Accordingly, a pattern of the liquid repellent region located on the upper surface of the insulating layer and the remaining lyophilic region can be easily formed. Further, since the light emitting layer can be formed on the predetermined area in good condition by forming the light emitting layer on the lyophilic region, an inconvenience, such as formation of a small clearance and uneven film thickness resulting from retreat of the light emitting layer, can be prevented.

The photocatalyst containing layer functions as a buffer layer in some cases. Therefore, it is effective to use the photocatalyst containing layer also for an advantage to improve the light emitting efficiency.

The energy used in the present embodiment is not particularly limited as long as it is sufficient to vary the wettability of the photocatalyst containing layer. In general, light comprising ultraviolet ray is preferably used.

The photocatalyst containing layer used in the present invention comprises a photocatalyst and a binder, as described above.

Examples of the photocatalyst to be used in the present embodiment include a titanium oxide ($TiO_2$), a zinc oxide (ZnO), a tin oxide ($SnO_2$), a strontium titanate ($SrTiO_3$), a tungsten oxide ($WO_3$), a bismuth oxide ($Bi_2O_3$) and iron oxide ($Fe_2O_3$). One kind or two or more kinds selected from these examples can be used as a mixture.

In the present embodiment, the titaium oxide is especially preferably used because it has a high band gap energy, is chemically stable, is non-toxic and is easily available. Either anatase-type or rutile-type titanium oxide can be used in the present invention. Anatase-type titanium oxide is preferable. The excitation wavelength for anatase-type titanium oxide is 380 nm or shorter.

As the anatase type titanium dioxide, for example, a hydrochloric acid peptization type anatase type titania sol (STS-02 (average particle size 7 nm) manufactured by Ishihara Sangyo Kaisha, Ltd., ST-K01 manufactured by Ishihara Sangyo Kaisha, Ltd.), a nitric acid peptization type anatase type titania sol (TA-15 (average particle size 12 nm) manufactured by Nissan Chemical Industries, Ltd.) and the like can be presented.

With a smaller particle size of the photocatalyst, the photocatalyst reaction can be generated effectively, and thus it is preferable. An average particle size of 50 nm or less is preferable, and use of a photocatalyst of 20 nm or less is particularly preferable. Further, the smaller the particle diameter of the photocatalyst is, the more preferable, because the surface roughness of the photocatalyst containing layer thus formed will be smaller. When the particle diameter of the photocatalyst exceeds 100 nm, the center line average surface roughness of the photocatalyst containing layer becomes rougher, resulting in poorer liquid repellency intrinsic to the photocatalyst containing layer and insufficient development of lyophilicity after exposure, which is not preferable.

As the binder used in the photocatalyst containing layer, those showing high bonding energy so that the main skeleton is not decomposed by light excitation of the above mentioned photocatalyst are preferable. For example, (1) an organo polysiloxane which provides high strength by hydrolyzing or polycondensating a chloro or alkoxy silane and the like by the sol gel reaction and the like, (2) an organopolysiloxane obtained by cross-linking a reactive silicone having the excellent liquid repellency or oil repellency and the like can be presented.

In the above mentioned case (1), it is preferably an organo polysiloxane which is a hydrolyzed condensate or a cohydrolyzed condensate of one kind or two or more kinds of silicon compounds represented by the general formula:

$Y_nSiX_{(4-n)}$ (Here, Y is an alkyl group, a fluoro alkyl group, a vinyl group, an amino group, a phenyl group or an epoxy group, X is an alkoxyl group, acetyl group or a halogen, and n is an integer from 0 to 3.). Here, the number of atoms of the group represented by Y is preferably in a range of 1 to 20. Moreover, the alkoxy group represented by X is preferably a methoxy group, an ethoxy group, a propoxy group, or a butoxy group.

Moreover, as a binder, an organo polysiloxane containing a fluoro alkyl group can be used particularly preferably. Specifically, a hydrolyzed condensate or a cohydrolyzed condensate of one kind or two or more kinds of the following fluoro alkyl silanes can be presented. Those generally known as a fluorine based silane coupling agent can be used.

Moreover, as the reactive silicone of the above mentioned (2), compounds having a skeleton represented by the following general formula can be presented.

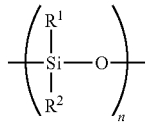

In the above general formula, n is an integer of 2 or more, $R^1$, $R^2$ each is a substituted or non substituted alkyl, alkenyl, aryl or cyano alkyl group having 1 to 10 carbon atoms, and 40% or less of the entirety based on the molar ratio is a vinyl, a phenyl, or a halogenated phenyl. Moreover, those having $R^1$, $R^2$ as a methyl group are preferable since the surface energy becomes smallest, and it is preferable that a methyl group accounts for 60% or more based on the molar ratio. Moreover, at least one reactive group such as a hydroxyl group is provided in a molecular chain at the chain end or the side chain.

Moreover, together with the above mentioned organo polysiloxane, a stable organo silicone compound not to have the cross-linking reaction such as a dimethyl polysiloxane can be mixed to the binder.

The photocatalyst content in the photocatalyst containing layer can be set in a range of 5 to 60% by weight, preferably 20 to 40% by weight. Moreover, the thickness of the photocatalyst containing layer is preferably in a range of 0.05 to 10 μm. If the photocatalyst containing layer has film thickness in the above mentioned range, the photocatalyst containing layer can exhibit a sufficient effect as the liquid repellent portion when the photocatalyst containing layer is utilized as the liquid repellent portion. And further, the photocatalyst containing layer can exhibit a sufficient function as a binder.

The photocatalyst containing layer can be formed by preparing a coating solution by dispersing the photocatalyst and the binder with other additives as necessary, in a solvent, and coating the coating solution. As the solvent to be used, an alcohol base organic solvent such as ethanol, isopropanol is preferable. Coating can be carried out by the known coating method such as spin coating, spray coating, dip coating, roll coating, bead coating and the like. When an UV curable component is contained as a binder, the photocatalyst containing layer can be formed by curing by irradiating an ultraviolet ray.

(Method for Manufacturing the EL Element)

Next, the method for manufacturing the EL element of the present invention will be described.

The method for manufacturing the EL element of the present invention can be devided into a third embodiment, fourth embodiment and fifth embodiment, depending on the manner of providing the liquid repellent portion. The method for manufacturing of each of these embodiments will be described hereinafter. In FIGS. 3A to 3F, 4A to 4F and 5A to 5G, showing processes of manufacturing in these embodiments, cases in which a layer having liquid repellency is separately provided on the upper surface of the insulating layer are shown. On the other hand, regarding the case in which a liquid repellent portion is formed on the upper surface of the insulating layer by directly subjecting a liquid repellency treatment, it is the same as that described in the aforementioned "EL element" section. Therefore, detailed description thereof will be omitted.

Third Embodiment (1) Third Embodiment

The third embodiment is an embodiment in which a layer having the liquid repellency is formed, on the upper surface of the insulating layer, as the liquid repellent portion. One example of manufacturing processes of the present embodiment is shown in FIGS. 3A to 3F. The third embodiment will be described in detail with reference to FIGS. 3A to 3F.

Figure 3A:
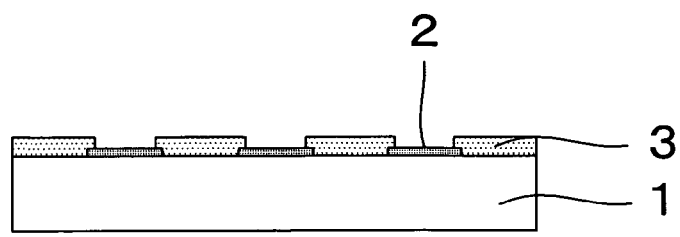
FIG. 3 is a schematic process drawing showing one example of a method for manufacturing an EL element of the present invention.
Figure 3B:
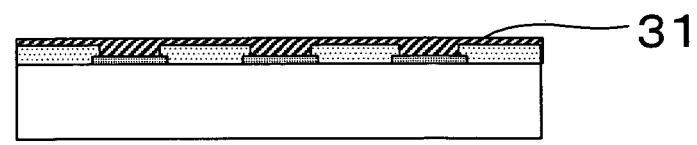
Figure 3C:
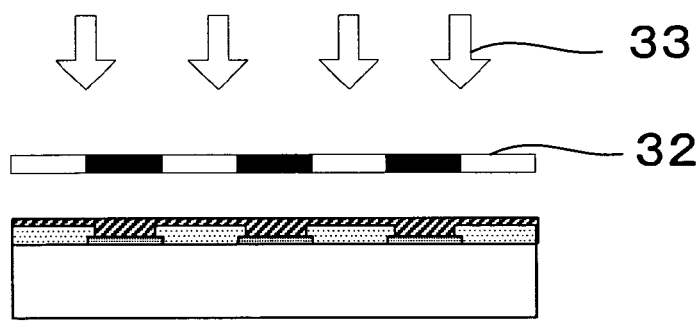
Figure 3D:
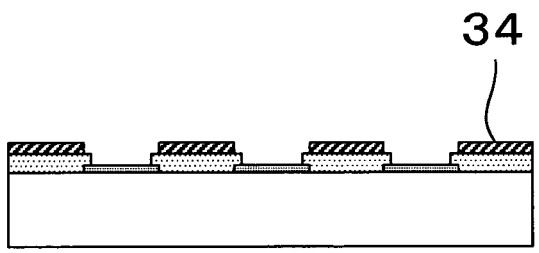
Figure 3E:
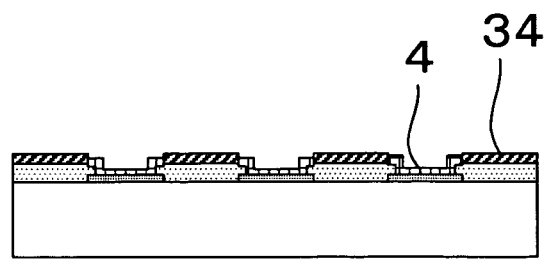
Figure 3F:
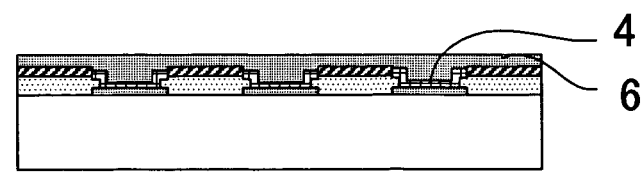

The present embodiment is characterized in comprising processes of:

forming an insulating layer 3 in a pattern, on a substrate 1 having at least a first electrode layer 2, so as to cover an edge portion of the first electrode layer 2, as shown in FIG. 3A (insulating layer forming process);

forming a resest layer 31 by coating the substrate 1, having at least the first electrode layer 2 and the insulating layer 3, with a photosensitive resin containing fluorine, as shown in FIG. 3B (resist layer forming process);

forming a liquid repellent portion 34 as shown in FIG. 3D, by patterning the resist layer 31 by irradiating 33 the resist layer 31, in a pattern via a mask 32 and developing, as shown in FIG. 3C (liquid repellent portion forming process);

forming a light emitting layer 4 on the substrate 1, having the first electrode layer 2, the insulating layer 3 and the liquid repellent portion 34, such that the light emitting layer 4 is formed on the first electrode layer 2 and creeps up to the end portions of the upper surface of the insulating layer 3, as shown in FIG. 3E (light emitting layer forming process); and forming a second electrode layer 6 as shown in FIG. 3F on the light emitting layer 4 such that the second electrode layer 6 so as to cross the first electrode layer 2 perpendicularly (second electrode layer forming process).

Hereinafter, each process of the third embodiment will be described in detail.

1. Insulating Layer Forming Process

The insulating layer forming process is a process of forming the insulating layer, on a substrate having at least a first electrode layer, so as to cover an edge portion of the first electrode layer.

First, a substrate provided with a first electrode layer in stripes is prepared. As methods for patterning the first electrode layer on the substrate include, for example, photolithography method, vacuum vapor deposition method, spattering method, metal fog method and the like. With regard to the first electrode layer, since it is the same as the first electrode layer described in the aforementioned "EL element" section, descriptions thereof will be omitted.

In order to prevent concentration of charge, an insulting layer is formed on the substrate, having the above mentioned first electrode layer, so as to cover the edge portions of the first electrode layer. Since the insulating layer is also required to be formed in a pattern, it can be formed by any one of the various patterning methods described above. With regard to the insulating layer, since it is the same as the insulating layer described in detail in the aforementioned EL element section, descriptions thereof will be omitted.

2. Resist Layer Forming Process

The resist layer forming process is a process of forming a layer of photosensitive resin containing fluorine as a resist layer by coating the substrate, having at least the first electrode layer and the insulating layer, which has been prepared in the insulating layer forming process, with a photosensitive resin containing fluorine, and curing the coating.

1) Photosensitive Resin

The photosensitive resin of the present invention may be either a positive type or a negative type. Specific examples of the photosensitive resin which can be used include a novolak type resin, a rubber-and-bisazide type resin.

These resins are dissolved in solvents, and optionally adding an additive. This is used as a coating solution.

2) Method for Preparing a Photosensitive Resin Containing Fluorine

Examples of the method for preparing a photosensitive resin containing fluorine include a method in which a monomer or oligomer having a fluorine group, a solution of a resin having a fluorine group, a surfactant having a fluorine group or the like is mixed to a photosensitive resin prior to the curing, thereby making the photosensitive resin contain fluorine.

3. Liquid Repellent Portion Forming Process

The liquid repellent portion forming process of the present embodiment is a process of patterning the resist layer formed of the fluorine containing photosensitive resin formed in the resist layer forming process, thereby forming the patterned resist layer as a liquid repellent portion.

Because the resist layer is a layer formed of the photosensitive resin, patterning of the resist layer can be easily carried out by photolithography. Specifically, by irradiating in a pattern and developing, after forming the resist layer, the resist layer can be easily patterned. Here, the energy irradiation and development when the resist layer formed in the above mentioned process is patterned by photolithography method will be described.

1) Energy Irradiation

After the resist layer is formed in the resist layer forming process, pattern irradiation is carried out to the portions where the liquid repellent portion is formed.

The entire area, where the insulating layer is placed, may be irradiated. However, it is preferable that the center portion of the insulating layer is irradiated in a pattern by 0.2 to 0.9 times, preferably 0.5 to 0.8 times of the width of the insulating layer.

When the photosensitive resin containing fluorine used as the material of the liquid repellent portion is a negative type, only the above mentioned area is exposed. In contrast, when a possitive type is used, the area other than the above mentioned area is exposed.

2) Development

Development is carried out by with a resist developer. The type of the resist developer is not particularly limited as long as it dose not dissolve the insulating layer and the like, which have already been formed on the substrate. Specifically, commonly used organic alkali type developer can be used. In addition, an inorganic alkali or an aqueous solution, which is capable of developing a resist, can be used. It is preferable that the substrate is cleaned with water after the resist layer has been developed.

4. Light Emitting Layer Forming Process

The light emitting layer forming process in the present embodiment is a process of forming a light emitting layer on the first electrode layer.

The light emitting layer of the present embodiment is formed in a region where the liquid repellent portions, formed in the previous process, is not formed. Specifically, the light emitting layer is formed on the first electrode layer and on the end portions of the insulating layer. Since the surface of the area, except for the areas where the liquid repellent portion is formed, has good adherence to the light emitting layer forming coating solution, small clearances are not formed at the side surfaces of the insulating layer which are in contact with the light emitting layer. Further, as the light emitting layer is formed so as to creep up to the end portions of the insulating layer, uneven film thickness of the light emitting layer located on the first electrode layer is not likely to be formed.

The method for forming the light emitting layer of the present embodiment is not particularly limited as long as the method utilizes the aforementioned light emitting layer forming coating solution. It is preferable that the light emitting layer forming coating solution is coated in a pattern by an ink jet method.

5. Second Electrode Layer Forming Process

The second electrode layer forming process of the present embodiment is a process of forming a second electrode layer on the light emitting layer so as to cross the first electrode layer, which is generally formed in stripes, perpendicularly.

The material for forming the second electrode layer is not particularly limited as long as it is a material capable of being formed by the vapor deposition method and having small work function. Since such material is the same as that described in the aforementioned EL element section, descriptions thereof will be omitted.

(2) Fourth Embodiment

The fourth embodiment of the present invention is an embodiment in which the liquid repellent portion is formed by using a photocatalyst containing layer whose wettability is varied by an energy irradiation. One example of manufacturing processes of the present embodiment is shown in FIGS. 4A to 4F. The fourth embodiment will be described specificlly with reference to FIGS. 4A to 4F.

Figure 4A:
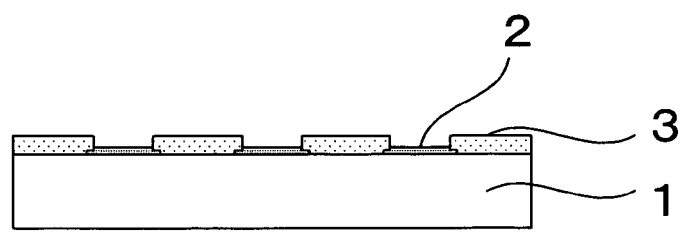
FIG. 4 is a schematic process drawing showing another example of a method for manufacturing an EL element of the present invention.
Figure 4B:
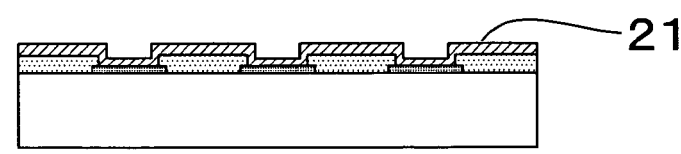
Figure 4C:
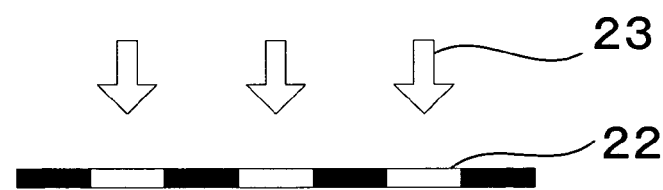
Figure 4D:
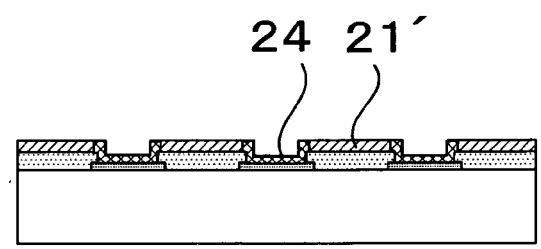
Figure 4E:
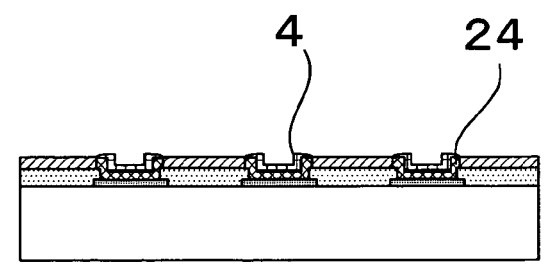
Figure 4F:
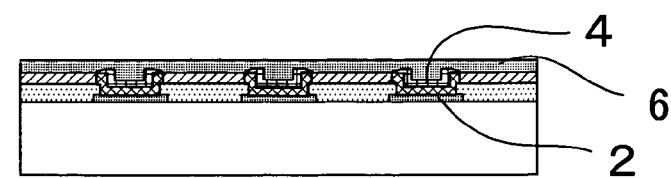

It is characterized in that the method at least comprises processes of:

forming an insulating layer 3, on a substrate 1 having at least a first electrode layer 2, in a pattern so as to cover the edge portions of the first electrode layer 2, as shown in FIG. 4A (insulating layer forming process);

forming a photocatalyst containing layer 21, on the substrate 1 having the insulating layer 3 provided thereon, comprising at least a photocatalyst and a binder, and whose wettability is varied by an energy irradiation, as shown in FIG. 4B (photocatalyst containing layer forming process);

forming, as shown in FIG. 4D, a liquid repellent portion 21', which is an non-energy irradiated area, and a lyophilic portion 24, which is an energy irradiated area and is changed to lyophilic, by irradiating 23 the photocatalyst containing layer 21 in a pattern via a mask 22 such that a part of the upper surface of the insulating layer is not irradiated with an energy, as shown in FIG. 4C (liquid repellent portion forming process);

forming a light emitting layer 4 by coating the lyophilic portion 24 with a light emitting layer forming coating solution, as shown in FIG. 4E (light emitting layer forming process); and forming a second electrode layer 6 on the light emitting layer 4 so as to cross the first electrode layer 2 perpendicularly, as shown in FIG. 4F (second electrode layer forming process).

In the processes of the present embodiment, the processes other than the photocatalyst containing layer forming process and the liquid repellent portion forming process are the same as those of the third embodiment. Thus, descriptions of these similar processes will be omitted.

1. Photocatalyst Containing Layer Forming Process

The composition of the photocatalyst containing layer is same as that of the photocatalyst containing layer described in "1. Photocatalyst containing layer" of (2) Second embodiment. Thus, descriptions thereof will be omitted.

In the present invention, the photocatalyst containing layer can be formed by the known coating method such as spin coating method, spray coating method, dip coating method, roll coating method, bead coating method and the like. When an UV-curing component is contained as a binder, the photocatalyst containing layer can be formed by curing by irradiating ultraviolet rays.

2. Liquid Repellent Portion Forming Process

The liquid repellent portion forming process is a process of forming the liquid repellent portion, which is an non-energy irradiated area, and a lyophilic portion, whose wettability is varied by an energy irradiation such that the contact angle to a coating solution is reduced, by forming a wettability difference pattern by irradiating the photocatalyst containging layer formed in the abovementioned process, whose wettability is varied by an energy irradiation, with an energy in a pattern. Since the liquid repellent portion is formed on the upper surface of the insulating layer, the pattern irradiation is carried out via a mask so that this area is not irradiated, thus, the wettability difference pattern is provided on the photocatalyst containing layer.

The energy used in the present process is appropriately selected depending on the types of the photocatalyst to be used, because the wavelength of light which a catalytic reaction is initiated varies depending on the band gap of the photocatalyst used in the present invention. For example, when cadmium sulfide is used as the photocatalyst, the wavelength is 496 nm, for iron oxide, the wavelength is a visible light of 539 nm. For titanium dioxide, the wavelength is an ultraviolet ray of 388 nm. Accordingly, any type of light including visible light and ultraviolet ray can be employed in the present embodiment. However, since titanium dioxide is preferably used as the photocatalyst, as described above because titanium dioxide is effective as a photocatalyst due to the high band gap energy, is chemically stable, non-toxic and easily available, light comprising ultraviolet ray is preferable as an energy for initiating a catalytic reaction of the titanium dioxide. Specifically, light comprising the ultraviolet ray in a range of 400 nm or less, more preferably 380 or less is preferable.

Examples of a light source of the light having such ultraviolet include various types of light sources of ultraviolet rays such as mercury lamp, metal halide lamp, xenon lamp, excimer lamp and the like.

The amount of irradiation of light during the energy irradiation may be set to an amount of irradiation necessary for the photocatalyst to decrease wettability of the irradiated area.

During the energy irradiation, when a pattern irradiation is requierd, such pattern irradiation can be carried out via a photomask using the above mentioned light source. Alternatively, the pattern irradiation can be carried out by a drawing irradiation in a pattern with a laser such as Excimer, YAG or the like.

(3) Fifth Embodiment

The aforementioned third embodiment is an embodiment in which the liquid repellent portion is formed by the photolithography method. However, in the present embodiment, an EL element having a structure similar to that of the EL element manufactured in the third embodiment can be manufactured without employing the photolithography method. The present embodiment has advantage in manufacturing efficiency in that development and cleaning processes essentially required in the photolithography method is not carried out.

The fifth embodiment having such an advantage is characterized in that the method at least comprises processes of: prepearing a photocatalyst treatment layer base material by providing a base material with a photocatalyst treatment layer containing at least a photocatalyst; forming an insulating layer on a substrate, having at least a first electrode layer, so as to cover edge portions of the first electrode layer; forming a decomposition removal layer, which is decomposed and removed by an action of a photocatalyst due to an energy irradiation, on the substrate having the first electrode layer and the insulating layer; patterning the decomposition removal layer by disposing the photocatalyst treatment layer of the photocatalyst treatment layer base material and the decomposition removal layer, such that the two layers are in contact with each other, then irradiating in a pattern with an energy from a predetermined direction; and peeling the photocatalyst treatment layer base material off from the decomposition removal layer.

One example of the processes of the present embodiment characterized as described above is shown in FIGS. 5A to 5G. The fifth embodiment will be described in detail with reference to FIGS. 5A to 5G.

Figure 5A:
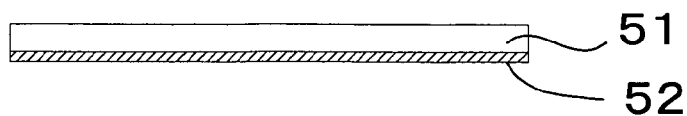
FIG. 5 is a schematic process drawing showing another example of a method for manufacturing an EL element of the present invention.

In this example, first of all, as shown in FIG. 5A, a photocatalyst treatment layer base material is formed by providing a substrate 51 with a photocatalyst treatment layer 52 comprising at least a photocatalyst (photocatalyst treatment layer base material prepearing process).

Figure 5B:
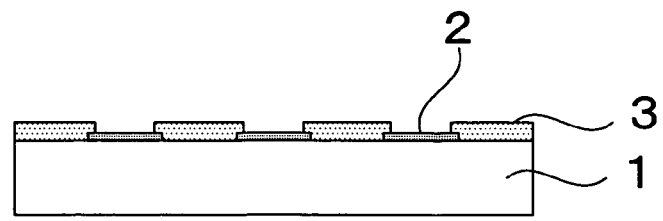

Next, aside from the aforementioned photocatalyst treatment layer base material, an insulating layer 3 is formed on a substrate 1, on which at least a first electrode layer 2 is patterned in advance in a predetermined pattern, so as to cover edge portions of the first electrode layer 2 (insulation layer forming process, see FIG. 5B).

Figure 5C:
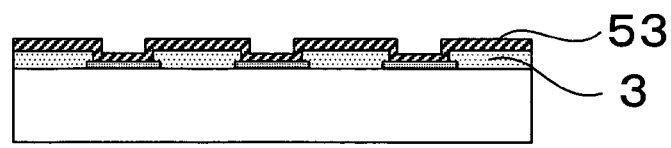

Further, as shown in FIG. 5C, a decomposition removal layer 53, which is liquid repellent and can is decomposed and removed by an action of a photocatalyst in the photocatalyst treatment layer 52, is formed on the substrate 1 having the insulating layer 3 on its surface (decomposition removal layer forming process).

Figure 5D:
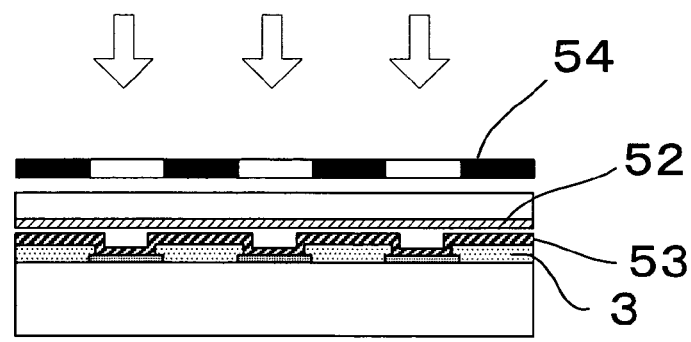

Next, as shown in FIG. 5D, disposeing the photocatalyst treatment layer 52 and the decomposition removal layer 53 such that the two layers are in contact with each other (contacting process). Thereafter, irradiating with an energy in a pattern via a photomask 54 from a predetermined direction (energy irradiating process), thereby patterning the decomposition removal layer 53 so as to be formed on the upper surface of the insulating layer 3.

The decomposition removal layer 53 in a pattern formed in the contacting process and the energy irradiating process is utilized as the liquid repellent portion 55 (liquid repellent portion forming process).

Figure 5E:
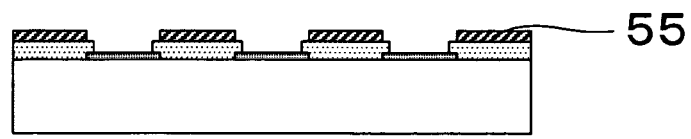

Next, the photocatalyst treatment layer base material is peeled off from the decomposition removal layer 53 (photocatalyst treatment layer peeling process), whereby a substrate 1, having the liquid repellent portion(s) 55 constituted of the patterned decomposition removal layer 53 formed on a surface, is obtained (see FIG. 5E).

Figure 5F:
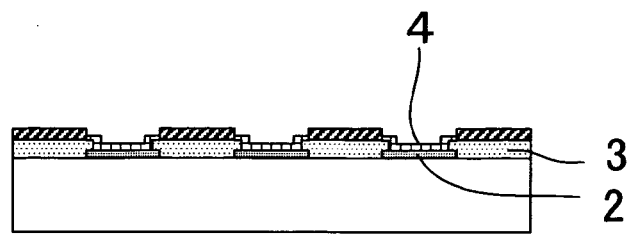
Figure 5G:
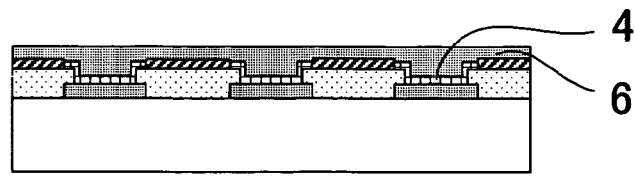

Further, as shown in FIG. 5F, a light emitting layer 4 is formed on the first electrode layer 2 and is formed so as to creep up to the end portions of the insulating layer 3 (light emitting layer forming process). Finally, by forming a second electrode layer 6 on the light emitting layer 4 so as to cross the first electrode layer 2 perpendicularly (second electrode layer forming process), whereby an EL element as shown in FIG. 5G is manufactured.

Hereinafter, each of the process of the present embodiment will be described in detail.

1. Photocatalyst Treatment Layer Base Material Preparing Process

The photocatalyst treatment layer base material preparing process of the present embodiment is a process of preparing a photocatalyst treatment layer base material having a substrate and a photocatalyst treatment layer containing a photocatalyst.

The photocatalyst treatment layer base material manufactured in the present process includes at least a photocatalyst treatment layer and a base material. In general, a thin film of the photocatalyst treatment layer is formed on the base material by a predetermined method. Moreover, the decomposition removal layer can be formed in a pattern by providing the photocatalyst treatment layer in a pattern or by providing a light shielding layer.

1) Photocatalyst Treatment Layer

The photocatalyst treatment layer used in the present invention is not particularly limited as long as the photocatalyst treatment layer successfully causes decomposition and removal of the decomposition removal layer described below, by the action of the photocatalyst contained in the photocatalyst treatment layer, when the decomposition removal layer and the photocatalyst treatment layer are brought into contact with each other and energy is irradiated thereon. What is minimally required of the photocatalytic-treatment layer is that it includes a photocatalyst. Accordingly, the photocatalyst containing layer described above could be used as it is. Alternately, the film can be formed only of a photocatalyst. Therefore, when the photocatalyst treatment layer comprises at least a photocatalyst and a binder, the composition thereof is the same as that of the photocatalyst containing layer described in "1. Photocatalyst containing layer" of the aforementioned second embodiment. Thus, details description of the photocatalyst treatment layer in this case will be omitted.

The photocatalyst used in the present invention is the same as that of the above mentioned photocatalyst containing layer. Thus, detailed description thereof will be omitted. The functional mechanism of the photocatalyst represented by titanium dioxide described above in the photocatalyst treatment layer is not entirely clear. It is assumed that carriers generated by irradiation of light are directly reacted with nearby compounds, or chemical structures of an organic substance is influenced by active oxygen species generated under the existence of oxygen and/or water. In the present invention, it is assumed that, in the photocatalyst treatment layer, the aforementioned carriers influence the compounds in the decomposition removal layer in contact.

When the photocatalyst treatment layer is composed of only the photocatalyst, the efficiency of decomposing and removing the decomposition removal layer is improved and time required for treatment is shortened, which is advantageous in terms of cost reduction. On the other hand, when the photocatalyst treatment layer comprises the photocatalyst and the binder, there is an advantage that such a photocatalyst treatment layer can be formed easily.

Examples of the method for forming the photocatalyst treatment layer composed of only the photocatalyst include vacuum film foring methods such as spattering method, CVD method, vacuum vapor deposition method and the like. By forming the photocatalyst treatment layer by the vacuum film foring method, the photocatalyst treatment layer having even film thickness and comprising only the photocatalyst can be formed, whereby decomposition and removal of the decomposition removal layer can be swiftly carried out.

2) Base Material

In the present invention, as shown in FIGS. 5A to 5G, the photocatalyst treatment layer base material comprises at least a base material and a photocatalyst treatment layer formed on this base material.

In the present embodiment, the material for forming the base material to be used is suitably selected in consideration of the direction of the energy irradiation in the liquid repellent portion forming process described below.

That is, for example, since the substrate, on which the decomposition removal layer is formed, is formed with an transparent material, when the energy is irradiated from the side of the substrate having the decomposition removal layer, the base material can be non-transparent. However, when the energy is irradiated in a pattern via a photomask on the side of the photocatalyst treatment layer base material, as shown in FIG. 5D, the base material of the photocatalyst treatment layer base material must be transparent. In short, whether a transparent or non-transparent substrate is to be used may be determined appropriately in each case.

The base material used in the present invention may be either flexible or inflexible. The flexibility of the base material is to be selected in accordance with the irradiation method in the liquid repellent portion forming process described below.

In short, the material of the base material used for the photocatalyst treatment layer base material in the present invention is not particularly limited. In the present invention, since the photocatalyst treatment layer base material is repeated used, a material having predetermined strength and having good adhereance to the photocatalyst treatment layer is preferably used for the substrate.

Specific examples of the material include glass, ceramic, metal, plastic and the like. Particularly, when the photomask is positioned on the side of the photocatalyst treatment layer base material, as shown in FIG. 5D, the base material must be transparent. In such a case, a transparent inflexible rigid material having no plasticity such as quartz glass, Payrex glass and synthetic quartz plate; and a transparent flexible material having plasticity such as transparent resin film and an optical resin plate can be used.

A primer layer may be formed on the base material in order to improve adhesion of the base material surface to the photocatalyst treatment layer. Examples of the material for forming such a primer layer include a silane base or titanium base coupling agent and the like.

2. Insulating Layer Forming Process

Next, the insulating layer is formed on the substrate, having at least the first electrode layer, so as to cover edge portions of the first electrode layer.

As the present process is the same as the insulating layer forming process described in detail in the methods for manufacturing of the other embodiments of the present invention, detailed description thereof will be omitted.

3. Decomposition Removal Layer Forming Process

Next, in the present invention, the decomposition removal layer, which can be decomposed and removed by the action of the photocatalyst contained in the photocatalyst treatment layer, is formed on the substrate on which the insulating layer is formed in the above mentioned insulating layer forming process.

1) Decomposition Removal Layer

The decomposition removal layer of the present embodiment is a layer having a property that is decomposed and removed by the action of photocatalyst due to the energy irradiation. The decomposition removal layer can be patterned easily by employing such a decomposition removal layer and irradiating with the energy in a pattern in a state in which the photocatalyst can act on the decomposition removal layer. Further, by making the decomposition removal layer liquid repellent, the decomposition removal layer formed in a pattern can be utilized as the liquid repellent portion.

The decomposition removal layer is removed without specific post treatment such as development, cleaning or the like since the layer is oxidized, decomposed and vaporized by the action of the photocatalyst due to an energy irradiation. However, a cleaning process and the like may be carried out, depending on the material of the decomposition removal layer.

In the present embodiment, since the decomposition removal layer is used as the liquid repellent portion, it is preferable that contact angle of the decomposition removal layer, to the light emitting layer forming coating solution, is 20° or more.

In the present invention, the non-irradiated part will be a part where the decomposition removal layer is remained, that is, the liquid repellent portion. Accordingly, if the contact angle of the decomposition removal layer, to the light emitting layer forming coating solution, is smaller than the above mentioned range, the liquid repellency of may not be sufficient and patterns of adjacent light emitting layers may be mixed with each other, which is not preferable.

Examples of the material for forming the decomposition removal layer include, for example, hydrocarbon base, fluorine base, or silicone base non-ionic surfactants.

The decomposition removal layer can be formed by: preparing a coating solution by dispersing the above mentioned components, optionally with an additive, in a solvent; and coating the substrate having the first electrode layer and the insulating layer, with this coating solution. The coating can be carried out by the known coating method such as spin coating, spray coating, dip coating, roll coating, bead coating and the like.

4. Liquid Repellent Portion Forming Process

In the liquid repellent portion forming process, a pattern of presence and absence of the decomposition removal layer is formed by: bringing the photocatalyst treatment layer into contact with the decomposition removal layer formed by the above mentioned decomposition removal layer forming process (contacting process); and irradiating with the energy in a pattern such that the upper surface of the insulating layer is not irradiated with the energy (energy irradiating process).

Hereinafter, the contacting process and the energy irradiating process, that constitute the liquid repellent portion forming process, will be described.

1) Contacting Process

In the present embodiment, when the energy is irradiated, as shown in FIG. 5D, it is necessary that energy is irradiated in a state in which the photocatalyst treatment layer 52 is disposed so as to be in contact with the decomposition removal layer 53 and that such a contacting state of the two layers is maintained during the energy irradiation process. Energy irradiation in such a manner is necessary for making the photocatalyst contained in the photocatalyst treatment layer act on the decomposition removal layer.

Here, "in contact" means a state in which the decomposition removal layer is disposed such that the photocatalyst can substantially act on the surface of the decomposition removal layer. And the concept includes a state in which the photocatalyst treatment layer and the decomposition removal layer are dosposed with a predetermined clearance in between, in addition to a satate in which the layers are physically in contact with each other.

Here, the above mentioned predetermined clearance is specifically in a range of 0.2 μm to 10 μm, and preferably in a range of 1 μm to 5 μm.

By disposing the photocatalyst treatment layer and decomposition removal layer with a predetermined clearance, desorption of oxygen, water and active oxygen species generated by the photocatalytic action is facilitated. Specifically, if the space in between the photocatalyst treatment layer and the decomposition removal layer is smaller than the above mentioned range, desorption of the above mentioned active oxygen species is difficult. As a result, there is a possibility that the rate of the wettability variation will be slower, which is not preferable. If the space in between the two layers is larger than the above mentioned range, it is difficult for the gererated active oxygen species to reach the decomposition removal layer. As a result, also in this case, there is a possibility that the rate of wettability variation will be slower, which is not preferable.

In the present invention, it suffices that the contact state as described above is maintained only during the exposure.

2) Energy Irradiating Process

In the present invention, while maintaining the above mentioned contact state, the portions in contact are irradiated with energy. It is preferable to use light as the energy because light is easy to control.

The wavelength of light used for such exposure is generally set in a range of 400 nm or less, preferably in a range of 380 nm or less. As mentioned above, this is because the preferable photocatalyst used in the photocatalyst treatment layer is the titanium dioxide, and the light having wavelength in the above mentioned range is preferable as energy for activating the photocatalytic action by the titanium dioxide.

Examples of a light source which can be used for such exposure include mercury lamp, metal halide lamp, xenon lamp, excimer lamp and other various types of light sources.

The amount of irradiation of energy during exposure is set at the amount of irradiation necessary for the irradiated part of the decomposition removal layer to be decomposed and removed by the action of the photocatalyst contained in the photocatalyst treatment layer.

5. Photocatalyst Treatment Layer Base Material Peeling Process

After the energy irradiation as described above is completed, the photocatalyst treatment layer base material is separated from the contact position to the decomposition removal layer. As a result, as shown in FIG. 5E, the decomposition removal layer formed in a pattern is bared. This pattern formed decomposition removal layer is utilized as the liquid repellent portion.

6. Light Emitting Layer Forming Process

The light emitting layer forming process is a process of forming a light emitting layer in an area where the liquid repellent portion, formed in the above mentioned liquid repellent portion forming process, has not been formed. Specifically, the light emitting layer is formed on the first electrode layer and formed such that the light emitting layer creeps up to the end portions of the insulating layer.

As the present process is basically the same as the light emitting layer forming process described in the method for manufacturing of the first embodiment, detailed description thereof will be omitted.

7. Second Electrode Layer Forming Process

The second electrode layer forming process is a process of forming a second electrode layer so as to cover the light emitting layer formed in the above mentioned light emitting layer forming process. As the present process is basically the same as the second electrode layer forming process described in the method for manufacturing of the first embodiment, detailed description thereof will be omitted.

It should be noted that the present invention is not limited to the embodiments described above. The aforementioned embodiments are merely examples, and whatever has substantially the same structure and achieves substantially the same functions and effects as the technological ideas described in the accompanying claims of the present invention is included in the technological scope of the present invention.

EXAMPLES

The present invention will be further described by the following examples.

Example 1

Preparation of a Light Emitting Layer Forming Coating Solution

A coating solution having the following composition was prepared.

| | |
|---|---|
| Polyvinylcarbazole | 7 parts by weight |
| Light emitting dye (R, G, B) | 0.1 parts by weight |
| Oxadiazole compound | 3 parts by weight |
| Toluene | 990 parts by weight |

The measured viscosity of the coating solution was 10 cps.

(Production of an EL Element)

A transparent electrode (ITO) was formed on a glass. By using a photosensitive material, an insulating layer was formed, on the transparent electrode, in stripes having line width of 20 μm and a 100 μm interval.

Thereafter, with a photosensitive material containing 2 wt % of fluorine type modifier (Modiper F200, manufactured by NOF Corporation), liquid repellent partitions of 16 μm width were formed on the insulating layer formed in stripes. A hole injecting layer was formed by coating a hole injecting material solution in between the insulating layers by using spin coating method or a dispenser method and drying the solution. Ink of R, G and B was discharged and coated in between the insulating layers by using an ink jet method. Thereafter, a second electrode layer was formed and a voltage was applied. Light emission without color mixture was confirmed for the three colors of R, G and B.

Comparative Example 1

A substrate was manufactured and an EL element was manufactured in a manner similar to that of Example, except for thath the fluorine type modifier was not added to the liquid repellent partitions. In this EL element, light emission was confirmed. However, color mixture of the three colors of R, G and B was observed in some parts.

Example 2

A transparent electrode (ITO) was formed on a glass. By using a photosensitive material, an insulating layer was formed, on the transparent electrode, in stripes having line width of 20 μm and a 100 μm interval. Thereafter, a photocatalyst containing layer was formed and UV wasd exposed in a pattern. Ink of R, G and B was discharged and coated on the UV-irradiated part by an ink jet method. Thereafter, a second electrode layer was formed and a voltage was applied. Light emission without color mixture was confirmed.

(Method for Manufacturing the Photocatalyst Containing Layer)

3 parts by weight of isopropyl alcohol and 2 parts by weight of anatase type titania sol were mixed and stirred at 90° C. for 10 minutes. 0.42 parts by weight of fluoroalkyl silane was further added, and the mixture was stirred at 90° C. for 10 minutes. The mixture was diluted by 2.5 times with isopropyl alcohol, whereby a solution was obtained. The substrate having the insulating layer was coated with the solution by spin coating at 2500 rpm, whereby a photocatalyst containing layer was formed.

Example 3

A transparent electrode (ITO) was formed on a glass. By using a photosensitive material, an insulating layer was formed, on the transparent electrode, in stripes having line width of 20 μm and a 100 μm interval. Thereafter, a photocatalyst containing layer was formed and UV was exposed in a pattern by using a mask for exposure on which the titanium oxide is attached. Ink of R, G and B was discharged and coated on the UV-irradiated part by an ink jet method. Thereafter, a second electrode layer was formed and a voltage was applied. Light emission without color mixture was confirmed.

(Method for Manufacturing Photocatalyst Treatment Layer)

A photocatalyst treatment layer was formed in a manner similar to that of method for manufacturing the photocatalyst containing layer, except that titania sol was added.

The invention claimed is:

1. An electroluminescent element comprising:
a substrate having at least a first electrode layer;
an insulating layer formed so as to cover an edge portion of the first electrode layer;
a liquid repellent portion provided only on an upper surface of the insulating layer;
a light emitting layer formed in a pattern on the first electrode layer; and
a second electrode layer formed on the light emitting layer, wherein the width of the liquid repellant portion is in a range of 0.2 times to 0.9 times the width of the insulating layer, and is formed at the center portion of the insulating layer, and further
wherein the light emitting layer is formed to creep up to end portions of an upper surface of the insulating layer.

2. The electroluminescent element according to claim 1, wherein a contact angle difference, to a coating solution having a 30 mN/m surface tension, between the liquid repellent portion and the insulating layer is 10° or more.

3. An electroluminescent element comprising:
a substrate having at least a first electrode layer;
an insulating layer formed so as to cover an edge portion of the first electrode layer;
a photocatalyst containing layer, formed on the first electrode layer and the insulating layer, composed of at least a photocatalyst and a binder;
a light emitting layer formed in a pattern on the photocatalyst containing layer; and
a second electrode layer formed on the light emitting layer,
wherein only a portion of the phatocatalyst containing layer, which is located on an upper surface of the insulating layer, Is a liquid repellent portion having liquid repellency, and the remaining portion of the photocatalyst containing layer is a lyophilic portion having liophilicity, and
the light emitting layer is formed on the lyophilic portion, and
wherein the width of the liquid repellant portion is in a range of 0.2 times to 0.9 times the width of the insulating layer, and is formed at the center portion of the insulating layer, and further
wherein a contact angle difference, to a coating solution having a 30 mN/m surface tension, between the liquid repellent portion and the lyophillic portion is 10° or more.

4. The electroluminescent element according to claim 3, wherein the photocatalyst is one kind or two or more kinds of substances selected from a titanium oxide ($TiO_2$), a zinc oxide (ZnO), a tin oxide ($SnO_2$), a strontium titanate ($SrTiO_3$), tungsten oxide ($WO_3$), bismuth oxide ($Bi_2O_3$) and an iron oxide ($Fe_2O_3$).

5. The electroluminescent element according to claim 4, wherein the photocatalyst is the titanium oxide.

6. The electroluminescent element according to claim 3, wherein the binder is an organo polysiloxane as a hydrolyzed condensate or a cohydrolyzed condensate of one kind or two or more kinds of silicon compounds represented by $Y_n SiX_{(4-n)}$ (Here, Y is an alkyl group, a fluoro alkyl group, a vinyl group, an amino group, a phenyl group or an epoxy group, X is an alkoxyl group or a halogen, and n is an integer from 0 to 3.).

7. A method for manufacturing an electroluminescent element, at least comprising processes of:
forming an insulating layer in a pattern, on a substrate having at least a first electrode layer, so as to cover an edge portion of the first electrode layer;
forming a photocatalyst containing layer, on the substrate having the insulating layer provided thereon, comprising at least a photocatalyst and a binder, and whose wettability is varied by an energy irradiation;
forming a liquid repellent portion, which is a non-energy irradiated area, and a lyophilic portion, which is an energy iraddiated area, by irradiating the photocatalyst containing layer in a pattern so as only an upper surface of the insulating layer maintains liquid repellency;
forming a light emitting layer by coating the lyophilic portion with a light emitting layer forming coating solution; and
forming a second electrode layer on the light emitting layer,
wherein the pattern irradiation is carried out so as to form the width of the liquid repellant portion in a range of 0.2 times to 0.9 times the width of the insulating layer, and at the center portion of the insulating layer, and further
wherein a contact angle difference, to a coating solution having a 30 mN/m surface tension, between the liquid repellent portion and the lyophillic portion is 10° or more.

8. A method for manufacturing an electroluminescent element, comprising processes of;
forming an insulating layer in a pattern, on a substrate having at least a first electrode layer, so as to cover an edge portion of the first electrode layer;
forming a resist layer by coating the substrate, having at least the first electrode layer and the insulating layer, with a photosensitive resin containing fluorine;
forming a liquid repellent portion of the resist layer by forming the resist layer only on an upper surface of the insulating layer, irradiating the resist layer, in a pattern via a photomask, and developing;
forming a light emitting layer at least on the first electrode layer of the substrate having the first electrode layer, the insulating layer and the liquid repellent portion provided thereon; and
forming a second electrode layer on the light emitting layer,
wherein the pattern irradiation is carried out so as to form the width of the liquid repellant portion in a range of 0.2 times to 0.9 times the width of the insulating layer, and at the center portion of the insulating layer, and further
wherein the light emitting layer is formed to creep up to end portions of an upper surface of the insulating layer.

9. The method for manufacturing an electroluminescent element according to claim 8, wherein a contact angle difference, to a coating solution having a 30 mN/m surface tension, between the liquid repellent portion and the insulating layer is 10° or more.

* * * * *